United States Patent
Roy et al.

(10) Patent No.: US 8,102,335 B2
(45) Date of Patent: Jan. 24, 2012

(54) IMAGE DISPLAY SCREEN AND METHOD FOR CONTROLLING SAID SCREEN

(75) Inventors: Philippe Le Roy, Betton (FR); Christophe Prat, Nantes (FR)

(73) Assignee: Thomson Licensing, Boulogne Billancourt (FR)

( * ) Notice: Subject to any disclaimer, the term of this patent is extended or adjusted under 35 U.S.C. 154(b) by 682 days.

(21) Appl. No.: 10/583,844

(22) PCT Filed: Dec. 20, 2004

(86) PCT No.: PCT/FR2004/003316
§ 371 (c)(1),
(2), (4) Date: Jun. 22, 2006

(87) PCT Pub. No.: WO2005/071755
PCT Pub. Date: Aug. 4, 2005

(65) Prior Publication Data
US 2008/0224960 A1    Sep. 18, 2008

(30) Foreign Application Priority Data
Dec. 24, 2003   (FR) .................................... 03 15408

(51) Int. Cl.
*G09G 3/30* (2006.01)
(52) U.S. Cl. ............................ 345/76; 345/82
(58) Field of Classification Search ............... 345/76, 345/82, 204
See application file for complete search history.

(56) References Cited

U.S. PATENT DOCUMENTS

| | | | |
|---|---|---|---|
| 5,903,246 A | 5/1999 | Dingwall | |
| 6,937,215 B2 * | 8/2005 | Lo | 345/82 |
| 2002/0126073 A1 | 9/2002 | Knapp et al. | |
| 2003/0067455 A1 | 4/2003 | Kasai | |
| 2003/0107534 A1 * | 6/2003 | Koyama et al. | 345/76 |
| 2004/0017365 A1 * | 1/2004 | Hatano et al. | 345/204 |

FOREIGN PATENT DOCUMENTS

| | | |
|---|---|---|
| JP | 10319437 | 12/1998 |
| JP | 2002518691 | 6/2002 |
| JP | 2003131618 | 5/2003 |
| WO | WO9965012 | 12/1999 |

OTHER PUBLICATIONS

Search Report Dated Apr. 26, 2005.
Jung et al., "P-104: A New Voltage Modulated AMOLED Pixel Design Compensating Threshold Voltage Variation of Poly-Si TFTs", Society for Information Display 2002 International Symposium Digest of Technical Papers, vol. XXXIII, No. I, P-104, May 21, 2002, pp. 622-625.

* cited by examiner

*Primary Examiner* — Yong H Sim
(74) *Attorney, Agent, or Firm* — Robert D. Shedd; Patricia A. Verlangieri

(57) ABSTRACT

The invention relates to an image display screen including:
  light emitters arranged as rows of light emitters and columns of light emitters,
  control means to control the emissions of the light emitters, including:
  a plurality of modulation transistors, each associated with one light emitter of the array, the said modulation transistors being positioned next to each other, along a guiding line,
  a plurality of compensating transistors intended to compensate for the threshold trigger voltage of the modulation transistors.

A single compensating transistor is connected to all the modulation transistors of a column and is intended to compensate for the threshold trigger voltages of all the said modulation transistors of this column. This compensating transistor is formed in the extension of the said modulation transistors of a column along the same guiding line. The invention also relates to a method for driving this screen.

11 Claims, 3 Drawing Sheets

IMAGE DISPLAY SCREEN AND METHOD FOR CONTROLLING SAID SCREEN

This application claims the benefit, under 35 U.S.C. §365 of International Application PCT/FRO4/03316, filed Dec. 20, 2004, which was published in accordance with PCT Article 21(2) on Aug. 4, 2005 in French and which claims the benefit of French patent application No. 0315408, filed Dec. 20, 2003.

The present invention relates to a display screen.

In particular, the invention relates to an active matrix display screen of the type based on electroluminescent organic material, with thin film transistors.

These transistors are produced by the crystallization of a polycrystalline silicon substrate obtained by a technique of heating an amorphous silicon substrate by a pulsed excimer laser. This technique for fabricating thin film transistors is very economical.

However, the crystallization of amorphous silicon results in the formation of grains of monocrystalline silicon of different orientation and separated by grain boundaries. These grain boundaries introduce dispersions of threshold trigger voltages of transistors and non-uniformities in the levels of current flowing through them for a given voltage applied to their gates. Now, since the light emitters of a screen produce light that is directly proportional to the current flowing through them, the threshold trigger voltage dispersions result in variations of luminance on the screen.

To compensate for these dispersions, there are known, particularly through documents WO 02/071379 and U.S. Pat. No. 6,359,605, display screens of the above-mentioned type. However, the compensating transistors of these screens are not formed in the extension of the line-arrangement of the modulation transistors of a column. This type of arrangement ensures in particular a voltage that is equal to or at least close to the threshold trigger voltages of the modulation transistors and the threshold trigger voltage of the compensating transistor(s) and consequently ensures improved uniformity of the luminance on the screen.

There is also known, particularly through document EP 1 220 191, the technique of introducing a compensating transistor in each addressing circuit of a light emitter of the screen. Each compensating transistor of an addressing circuit is fabricated next to the modulation transistor of this same circuit. Thus, the modulation transistor and the compensating transistor of the same addressing circuit are produced under the same conditions by the same rectilinear laser beam such that their threshold trigger voltages have similar values intended to compensate for each other.

However, with such a screen, an initialization transistor and a selection transistor also need to be fabricated, resulting in a total of four transistors to control the emission of each light emitter of the screen. Now, these transistors significantly reduce the useful emission surface area of the pixels. Furthermore, the fabrication of a large number of transistors is not an economical process.

The invention aims to propose a screen of the abovementioned type that is simpler to produce and more economical.

To this end, one subject of the invention is a display screen including:
  light emitters arranged as rows of light emitters and columns of light emitters to form an array of light emitters,
  a silicon substrate on which control means to control the emissions of the light emitters are fabricated, the said control means including:
  means for powering the light emitters,
  a plurality of addressing electrodes arranged according to the columns of light emitters, and intended to transmit a voltage representing an image datum to each column of light emitters,
  a plurality of selection electrodes arranged according to the rows of light emitters, and intended to transmit a selection signal to each row of light emitters,
  a plurality of modulation transistors, each associated with a light emitter of the array, the said modulation transistors including a gate electrode intended to be connected to an addressing electrode and two current-carrying electrodes, each modulation transistor intended to have a drain current pass through it to power the said light emitter for a voltage between its gate electrode and one of its current-carrying electrodes that is greater than or equal to a threshold trigger voltage, the said modulation transistors being arranged in columns associated with the columns of light emitters and being aligned on the substrate according to a guiding line,
  a load capacitor connected to the terminals of each modulation transistor and intended to set an electric potential at the gate electrode of the associated modulation transistor, and
  a plurality of compensating transistors intended to compensate for the threshold trigger voltage of the modulation transistors by adjusting the charge on the capacitor,
characterized in that it includes a single compensating transistor connected to all the modulation transistors of a given column and intended to compensate for the threshold trigger voltages of all the said modulation transistors of this column; the said compensating transistor is formed in the extension of the line-arrangement of the said modulation transistors of a given column according to the said same guiding line.

According to one characteristic of the invention, the control means do not include any means allowing the flow of current from any one of the addressing electrodes to the means for powering the light emitters.

Each modulation transistor associated with a light emitter may carry a drain current to power the said light emitter, this powering current hence flowing between two powering electrodes which are different from the addressing electrodes. Thus, there is no need for any switches connecting an addressing electrode to a power generator for the light emitters.

Such switches are however present in the control means described in document WO 02/071379 or in document U.S. Pat. No. 6,359,605. In the control means described in these documents, the addressing electrodes are for transmitting a current ID representing an image datum to the light emitters, whereas in the case of the invention they are for transmitting a voltage $V_D$. Since programming is carried out by current (and not by voltage as in the invention), the above-mentioned connecting switches are needed to ensure that the programming current flows between each addressing electrode and the circuit for powering the light emitters, while the gate voltage of the modulator associated with this light emitter gradually settles on its set value, for example, by the known current mirror system.

According to particular embodiments, the display screen has one or more of the following characteristics:
  the control means include at least one voltage generator connected to one or to each addressing electrode in order to transmit a voltage $V_D$ representing an image datum;
  the compensating transistor of each column of light emitters includes two current-carrying electrodes, each current-carrying electrode being connected in series between the addressing electrode of this same column and the modulation transistors of this same column;

each compensating transistor includes a gate electrode and two current-carrying electrodes, the gate electrode of each compensating transistor being connected to the gate electrode of all the modulation transistors of the associated column; one current-carrying electrode of each compensating transistor is connected to the addressing electrode of the associated column of light emitters, and the other current-carrying electrode of each compensating transistor is connected to its gate electrode;

the said modulation transistors and the said associated compensating transistor are fabricated on a polycrystalline silicon substrate obtained by heating an amorphous silicon substrate, using a laser beam, the said beam being intended first to heat a first rectangular heating surface of the substrate, then to move in a direction of movement and then to heat a second rectangular heating surface; and the said modulation transistors associated with the light emitters of a given column and the associated compensating transistor are aligned in one and the same heating surface, the guiding alignment line extending approximately perpendicularly to the direction of movement of the laser beam;

the said modulation transistors and the said associated compensating transistor each include a channel between two layers of doped material, the said channel being connected to their gate electrode, and the channel of the modulation transistors of a column and the channel of the associated compensating transistor have a main axis approximately parallel to the said guiding line;

the control means include initialization means for initializing the load capacitors intended to discharge all the load capacitors connected to the modulation transistors of a column;

the initialization means include an initialization transistor having a gate electrode and two current-carrying electrodes, one current-carrying electrode of the said initialization transistor being connected to the gate electrode of the modulation transistors of the said column, the gate electrode of the said initialization transistor being connected to a current-carrying electrode and to the addressing electrode of a column of light emitters;

the initialization means include a diode, the cathode of which is connected to the gate electrode of the modulation transistors and the anode of which is connected to the addressing electrode of a column of light emitters;

the control means include a plurality of selection transistors having a gate electrode and two current-carrying electrodes, each selection transistor having one current-carrying electrode connected to a modulation transistor, a gate electrode connected to a selection electrode and one current-carrying electrode connected to the compensating transistor of a column of light emitters;

the light emitters are organic electroluminescent diodes.

Another subject of the invention is a method for driving a display screen, including:

light emitters arranged as rows of light emitters and columns of light emitters to form an array of light emitters;

a silicon substrate on which control means to control the emissions of the light emitters are fabricated, the said control means including:

a plurality of addressing electrodes arranged according to the columns of light emitters, and intended to transmit a voltage representing an image datum to each column of light emitters, a plurality of selection electrodes arranged according to the rows of light emitters, and intended to transmit a selection signal to each row of light emitters, a plurality of modulation transistors, each associated with a light emitter of the array, the said modulation transistors including a gate electrode intended to be connected to an addressing electrode and two current-carrying electrodes, each modulation transistor intended to have a drain current pass through it to power the said light emitter for a voltage between its gate electrode and one of its current-carrying electrodes that is greater than or equal to a threshold trigger voltage, the said modulation transistors being arranged in columns associated with the columns of light emitters and being aligned on the substrate according to a guiding line, a load capacitor connected to the terminals of each modulation transistor and intended to set an electric potential at the gate electrode of the associated modulation transistor, and a plurality of compensating transistors intended to compensate for the threshold trigger voltage of the modulation transistors by adjusting the charge on the capacitor, characterized in that the method includes:

a step for forming a single compensating transistor connected to all the modulation transistors of a given column, the said compensating transistor being formed in the extension of the line-arrangement of the said modulation transistors of this same column, according to the said same guiding line; and a step for compensating for the threshold trigger voltages of all the said modulation transistors of this same column, the said compensation being performed by the sole compensating transistor; and a voltage-based step for driving the light emitters of the screen, via the control means.

The invention will be better understood upon reading the following description given only by way of example and with reference to the drawings in which:

FIG. 3A is a graph showing a selection voltage applied to the first selection electrode of a first addressing circuit;

FIG. 3B is a graph showing a voltage applied to an addressing electrode of a column of light emitters;

FIG. 3C is a graph showing a selection voltage applied to a second selection electrode of a second addressing circuit;

FIG. 3D is a graph showing a voltage stored by a load capacitor of a first addressing circuit; and FIG. 3E is a graph showing a voltage stored by a load capacitor of a second addressing circuit.

Figure 1:
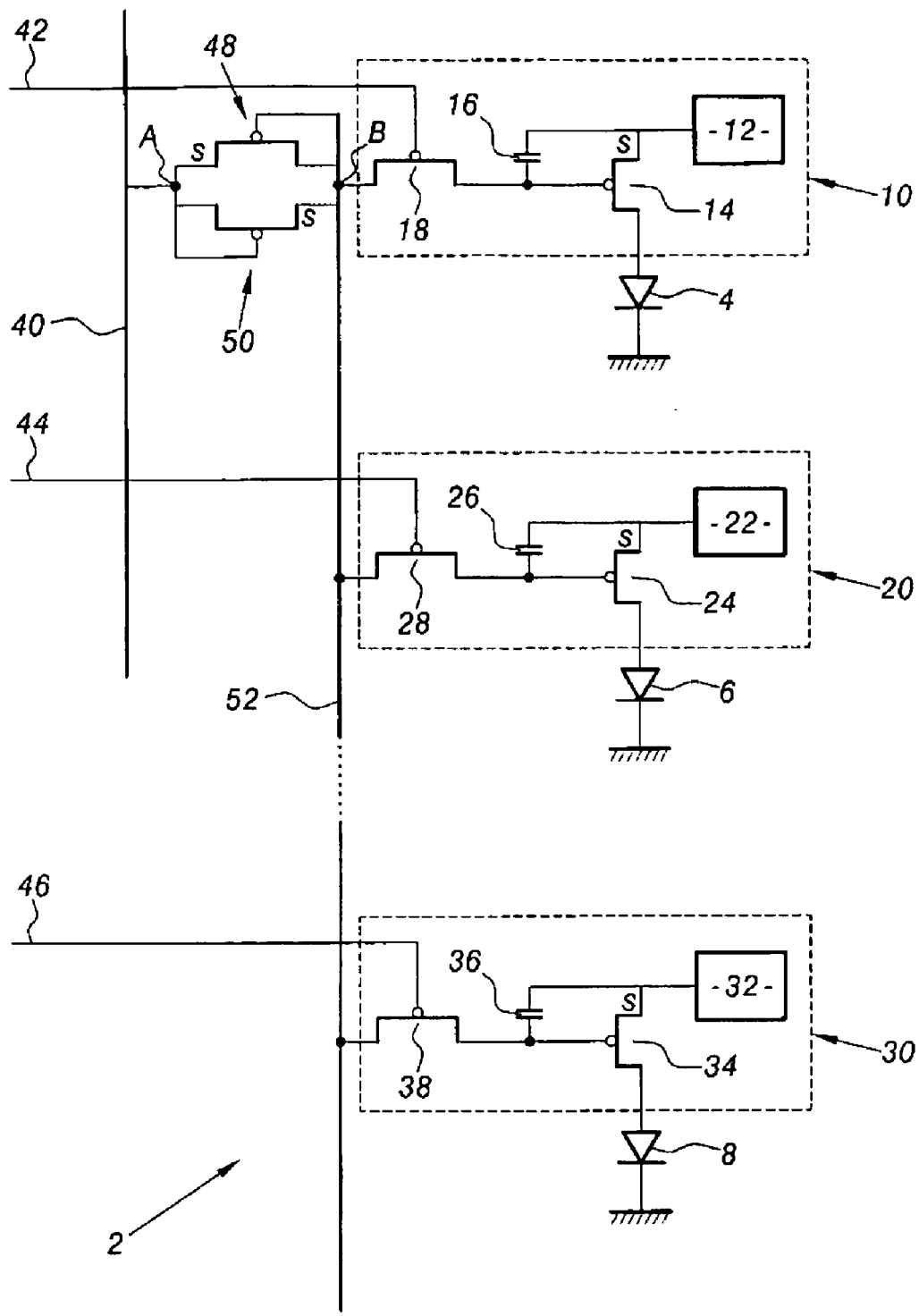
FIG. 1 is a partial schematic view of a screen according to the invention.

FIG. 1 partially represents a display screen according to the invention. This screen includes means 2 for controlling the emission of light from a group of image elements or pixels.

The screen includes light emitters 4, 6, 8 formed from organic electroluminescent diodes, known by the acronym OLED, the luminance of which is directly proportional to the current flowing through them. They are arranged in rows of light emitters and in columns of light emitters and form an array.

The control means 2 include a plurality of addressing circuits 10, 20, 30 each connected to a light emitter 4, 6, 8, one addressing electrode 40 per column of light emitters, one selection electrode 42, 44, 46 per row of light emitters, one compensating transistor 48 and one initialization transistor 50 per column of light emitters.

Each addressing electrode 40 is connected to a voltage generator specifically intended to apply to it a voltage representing an image datum.

For the sake of simplicity, only three light emitters of a given column of light emitters and control means 2 for addressing these light emitters have been represented in FIG. 1.

The first light emitter 2 of the column of light emitters is connected to a first addressing circuit 10. The second light emitter 4 of the column of light emitters is connected to a second addressing circuit 20. Lastly, the third light emitter 6 of the column of light emitters is connected to a third addressing circuit 30. The addressing circuits 10, 20, 30 of this column are connected to the same addressing electrode 40, but are each connected to a different selection electrode.

The first 10, second 20 and third 30 addressing circuits are identical; they have the same electronic components, connected in the same way to perform the same functions. To simplify the description, only the first addressing circuit 10 will be described in detail. However, to differentiate between the components of the different addressing circuits, the reference labels of the other addressing circuits have the same unit digits as those of the first addressing circuit 10, but different tens.

The addressing circuits 10, 20, 30 include a generator 12, 22, 32 for powering the light emitters, a current modulation transistor 14, 24, 34, a load capacitor 16, 26, 36 and a selection switch 18, 28, 38 formed from a transistor.

The modulation transistor 14, the selection switch 18, the compensating transistor 48 and the initialization transistor 50 are p-type thin film transistors. They have a drain electrode, a source electrode and a gate electrode. Their gate electrode is connected to a drain channel formed between two layers of doped material. They are intended to have a current, called the drain current, pass through them from their source to their drain when a voltage that is greater than or equal to their threshold trigger voltage $V_{th}$ is applied between their gate and their source. Alternatively, n-type thin film transistors may also be used for fabricating a screen according to the invention. In that case, their drain current flows from their drain to their source.

The source of the modulation transistor 14 is connected to the generator 12. The drain of the modulation transistor 14 is connected to the anode of the light emitter 4. The cathode of the light emitter 4 is connected to a ground electrode. The gate of the modulation transistor 14 is connected to one terminal of the load capacitor 16 and to the drain electrode of the selection switch 18. The second terminal of the load capacitor 16 is connected to the generator 12. The gate of the switches 18, 28 and 38 of the first 10, second 20 and third 30 addressing circuits is connected to the first 42, second 44 and third 46 selection electrodes respectively.

The compensating transistor 48 is connected in parallel with the initialization transistor 50 and is connected at one end to node B and at the other end to a node A for connecting to the column addressing electrode 40.

The source electrode of the transistor 48 and the drain electrode of the transistor 50 are connected to the addressing electrode 40 of the column of light emitters. The drain electrode of the transistor 48 and the source electrode of the transistor 50 are connected together at node B.

The gate electrode of the transistor 48 is connected to its drain. The gate electrode of the transistor 50 is also connected to its drain. Therefore, the compensating transistor 48 is equivalent to a diode, the cathode of which is connected to node B and the anode of which is connected to node A. This diode is conducting when the potential difference between node A and node B is greater than the threshold trigger voltage $V_{th48}$ of the transistor 48. The initialization transistor 50 is also equivalent to a diode. This diode is connected in the opposite sense compared to the diode that is equivalent to the transistor 48. Its cathode is connected to node A. Its anode is connected to node B. This diode is conducting when the potential difference between node A and node B is less than the threshold trigger voltage $V_{th50}$ of the transistor 50.

The drain electrode of the transistor 48 and the source electrode of the transistor 50 are connected via a line 52 to each switch 18, 28, 38 of all the addressing circuits 10, 20, 30 of the column of light emitters.

The gate of the compensating transistor 48 is connected to the gate of the modulation transistors 14, 24, 34 of all the addressing circuits 10, 20, 30 of a column of light emitters.

Furthermore, the compensating transistor 48 is fabricated under the same conditions as all the modulation transistors 14, 24, 34 of a column of light emitters such that it can compensate for the threshold trigger voltages of all the modulation transistors 14, 24, 34 of this column.

The addressing electrode 40 of a column of light emitters is designed to convey an addressing voltage representing an image datum to the addressing circuits of this column of light emitters.

The selection electrodes 42, 44, 46 are specifically for selecting a defined addressing circuit 10, 20, 30 in a column of addressing circuits by applying a selection voltage to one of these row selection electrodes.

Figure 2:
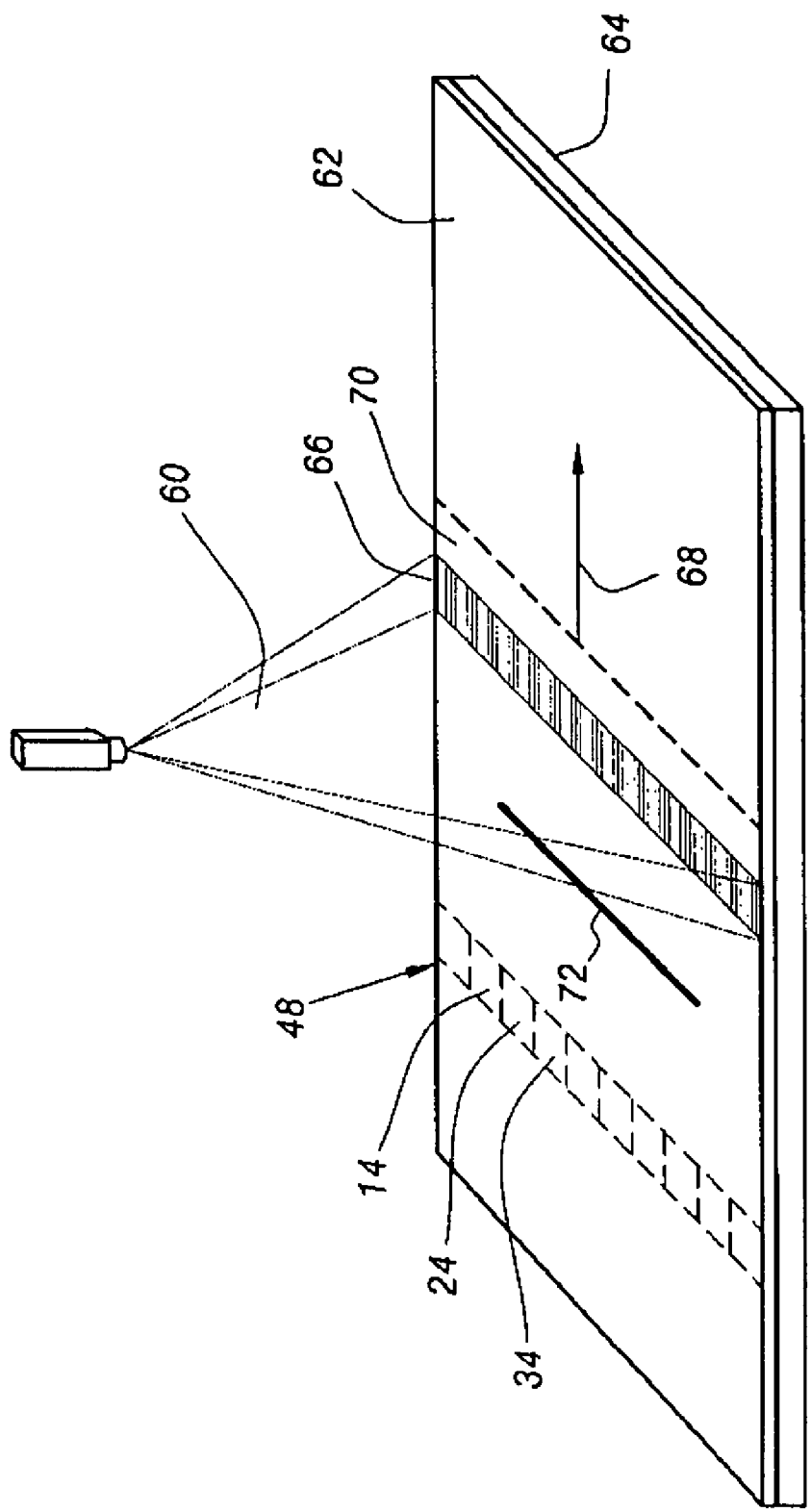
FIG. 2 is a perspective view representing a silicon substrate heated by a laser beam during the fabrication process of the transistors arranged in the display screen according to the invention.

FIG. 2 schematically shows a step in the low temperature process of fabrication of the poly-silicon forming the structure of the transistors used to generate a screen according to the invention.

The modulation transistors 14, 24 and 34 and the compensating transistor 48 are formed in the same layer of polycrystalline silicon obtained after heating and crystallizing an amorphous silicon substrate.

During the step of heating of the amorphous silicon substrate 62, a rectilinear excimer laser beam 60 heats a thin layer 62 of amorphous silicon deposited on a glass substrate 64. This pulsed laser beam 60 first heats a first rectangular surface 66 which extends longitudinally along a guiding line 72, then moves in a direction of movement 68 and then heats a second heating surface 70 that is next to the first heating surface 66 and of the same shape as the first heating surface 66.

The modulation transistors of a column of light emitters and the compensating transistor 48 intended to compensate for the threshold trigger voltage of all the modulation transistors of this column have been represented schematically in dotted-line form in FIG. 2.

The modulation transistors 14, 24, 34 of a column addressed by the same addressing electrode 40 and the compensating transistor 48 to which they are connected are formed in such a way that they are positioned one after the other in a line that is parallel to the long sides of the heating surfaces 66, 70 and perpendicular to the direction of movement 68 of the laser beam 60. Furthermore, these transistors are fabricated on one and the same heating surface 66 heated, at the same time, by the same laser beam 60. More specifically, the modulation transistors 14, 24 and 34 and the compensating transistor 48 are produced such that their drain channel has a main axis approximately perpendicular to the direction 68 of movement of the laser beam.

Therefore, they present threshold trigger voltages having similar values such that the compensating transistor 48 is able to compensate for the threshold trigger voltages of all the modulation transistors 14, 24, 34 of a column of light emitters.

FIGS. 3A to 3E represent the steps for addressing the light emitters of a display screen according to the invention.

Figure 3A:
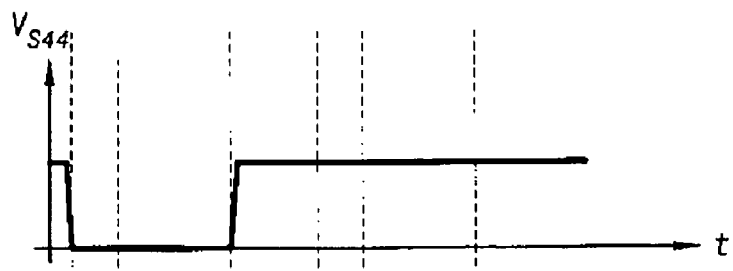
FIGS. 3A to 3E are graphs showing how the applied voltages change over time during the addressing method performed by the control means according to the invention; in particular.
Figure 3B:
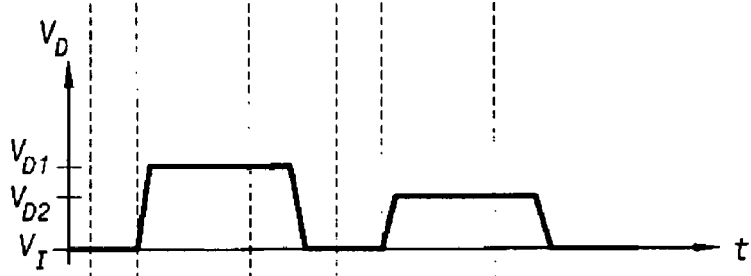
Figure 3C:
Figure 3D:
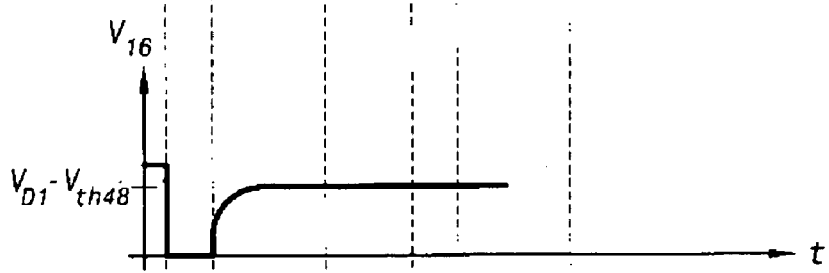
Figure 3E:
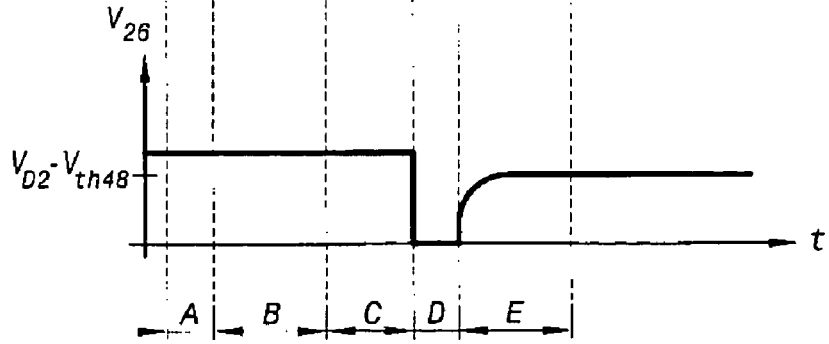

In a step A for initializing the modulation transistor 14, a selection voltage $V_{S42}$ is applied to the electrode 42. The switch 18 closes. An addressing voltage $V_D$, having a value of zero, from now on called the initialization voltage $V_I$, is applied to the addressing electrode 40. The voltage at node A is less than the voltage at node B. The initialization transistor 50 becomes conducting, while the compensating transistor 48 stops conducting. The initialization voltage is then applied to the gate of the modulator 14 and to a terminal of the load capacitor 16 which discharges, as illustrated in FIG. 3D.

In a step B for programming the load capacitor 16, an addressing voltage $V_{D1}$, representing an image datum, is applied to the addressing electrode 40; this voltage is modulated by the compensating transistor 48 and is transmitted to node B. At node B, the value of the voltage modulated by the transistor 48 is equal to $V_{D1}-V_{th48}$ where $V_{th48}$ is the threshold trigger voltage of the transistor 48.

The selection voltage $V_{S42}$ is still applied to the gate of the selection switch 18; the switch 18 is closed. The addressing voltage $V_{D1}$ modulated by the compensating transistor 48, is applied to the gate of the modulation transistor 14 and to one terminal of the load capacitor 16. After an instant, the modulation transistor 14 is in the saturation regime of operation and its drain current $I_d$ is defined by the following equation:

$$I_d = \beta \times (V_{gs14} - V_{th14})^2$$

where $$V_{gs14} = V_{12} - V_{16}$$

and $$V_{16} = V_{D1} - V_{th48}$$

where $I_d$ is the drain current flowing through the modulation transistor 14,
β is a constant that is a function of the technology adopted and of the characteristics of the channel of the transistors,
$V_{gs14}$ is the voltage between the gate and the source of the modulation transistor 14,
$V_{12}$ is the powering voltage from the generator 12,
$V_{16}$ is the voltage across the terminals of the load capacitor 16,
$V_{D1}$ is the data addressing voltage,
$V_{th48}$ is the threshold trigger voltage of the compensating transistor 48.

Since the modulation transistors 14 and the compensating transistor 48 have been fabricated on the same heating surface, they have similar threshold trigger voltages.

$$V_{th48} = V_{th14}$$

then $$I_d = \beta \times (V_{12} - V_{D1})^2$$

Thus, the drain current $I_d$ flowing through the modulation transistor 14 is independent of its threshold trigger voltage $V_{th14}$. The threshold trigger voltage $V_{th48}$ of the compensating transistor 48 compensates for the threshold trigger voltage of the modulation transistor $V_{th14}$ such that the luminance of the pixel associated with the light emitter 2 is constant for a given addressing voltage.

In an intermediate step C, a selection voltage $V_{S44}$ is applied to the second selection electrode 44. The switch 28 of the second addressing circuit 20 closes. At the end of step C, the selection voltage $V_{S42}$ is no longer applied to the selection electrode 42 of the first addressing circuit 10 meaning that the switch 18 opens. The load capacitor 16 stores charge at the gate of the modulation transistor 14 such that the latter continues to power the light emitter 4 until the next initialization step $V_I$ of the modulator 14, as illustrated in FIG. 3D.

In a step D for initializing the load capacitor 26 of the second addressing circuit 20, an addressing voltage $V_D$, having a value of zero and called the initialization voltage $V_I$, is applied to the column addressing electrode 40. Therefore, the voltage at node A becomes less than the voltage at node B. The initialization transistor 50 becomes conducting and the compensating transistor 48 stops conducting. The initialization voltage conveyed by the addressing electrode 40, modulated by the transistor 50, is then transferred to the terminals of the load capacitor 26 which discharges.

In a step E for programming the load capacitor 26, an addressing voltage $V_{D2}$ is applied to the addressing electrode 40. The voltage at node A becomes greater than the voltage at node B. The compensating transistor 48 becomes conducting again while the initialization transistor 50 stops conducting. The voltage at node B, modulated by the compensating transistor 48 is equal to $V_{D2} - V_{th48}$ where $V_{th48}$ is the threshold trigger voltage of the compensating transistor 48. The voltage at node B is transmitted to the gate of the modulator 24 by the line 52 and the switch 28 which has been closed due to the application of a selection voltage $V_{S44}$ to the selection electrode 44.

Since the modulation transistors 24 and the compensating transistor 48 have been fabricated on the same heating surface along the same guiding line 72, the threshold voltage $V_{th48}$ of the transistor 48 is the same as the threshold voltage $V_{th24}$ of the transistor 24.

$$V_{th48} = V_{th24}$$

Therefore, $$I_d = \beta \times (V_{22} - V_{D2})^2$$

where $V_{22}$ is the powering voltage from the generator 22, $V_{D2}$ is the data addressing voltage.

Thus, the compensating transistor 48 is capable of compensating for the threshold trigger voltage of the modulation transistor 14 of the first addressing circuit 10, of the modulation transistor 24 of the second addressing circuit 20 and of all the modulation transistors of a given column when its transistors are obtained by the heating of a surface of silicon, at the same time, and arranged along the same line.

Furthermore, the initialization transistor 50 for the load capacitors is intended to discharge all the load capacitors 16, 26, 36 of the addressing circuits of a given column.

Alternatively, the initialization transistor 50 may be replaced by a diode, the cathode of which is connected to the gate electrode of the modulation transistors and the anode of which is connected to the addressing electrode of the light-emitter column associated with the said column of transistors.

Advantageously, the addressing circuits of the screen according to the invention are voltage driven meaning that the pixels are addressed faster. Specifically, current-based programming times are no longer necessary since the voltage is directly applied to the gate of the modulators and to the load capacitors. In additions the voltage driven addressing circuits are simple to implement and have a fabrication cost that is favourable compared to current-based addressing circuits.

The invention claimed is:

1. Display screen including:
   light emitters arranged as rows of light emitters and columns of light emitters to form an array of light emitters,
   a silicon substrate on which control means to control the emissions of the light emitters are fabricated, the said control means including:
   means for powering the light emitters,
   a plurality of addressing electrodes arranged according to the columns of light emitters, and intended to transmit a voltage representing an image datum to each column of light emitters,
   a plurality of selection electrodes arranged according to the rows of light emitters, and intended to transmit a selection signal to each row of light emitters,
   a plurality of modulation transistors, each associated with a light emitter of the array, the said modulation transistors including a gate electrode intended to be connected to an addressing electrode and two current-carrying electrodes, each modulation transistor intended to have a drain current pass through it to power the said light emitter for a voltage between its gate electrode and one of its current-carrying electrodes that is greater than or equal to a trigger voltage, the said modulation transistors being arranged in columns associated with the columns of light emitters and being geometrically aligned on the substrate along a guiding line,
   a load capacitor connected to the terminals of each modulation transistor and intended to set an electric potential at the gate electrode of the associated modulation transistor, and
   a plurality of compensating transistors intended to compensate for the trigger voltage of the modulation transistors by adjusting the charge on the capacitor,
   wherein a single compensating transistor is connected to all the modulation transistors of a given column and is intended to compensate for the trigger voltages of all the said modulation transistors of this column,
   wherein said compensating transistor of a given column is formed in the geometrical extension of the line-arrangement of the said modulation transistors of said given column along said same guiding line,
   wherein said modulation transistors and said associated compensating transistor are fabricated on a polycrystalline silicon substrate obtained by heating an amorphous silicon substrate, using a laser beam, said beam being intended first to heat a first rectangular heating surface of the substrate then to move in a direction of movement and then to heat a second rectangular heating surface, and
   wherein said modulation transistors associated with the light emitters of a given column and the associated compensating transistor are aligned in one and the same heating surface, the guiding alignment line extending approximately perpendicularly to the direction of movement of the laser beam.

2. Display screen according to claim 1, wherein the control means do not include any means allowing the flow of current from any one of the addressing electrodes to the means for powering the light emitters.

3. Display screen according to claim 1, wherein the control means include at least one voltage generator connected to one or to each addressing electrode in order to transmit a voltage representing an image datum.

4. Display screen according to claim 1, wherein the compensating transistor of each column of light emitters includes two current-carrying electrodes, each current-carrying electrode being connected in series between the addressing electrode of this same column and the modulation transistors of this same column.

5. Display screen according to claim 1, wherein each compensating transistor includes a gate electrode and two current-carrying electrodes, the gate electrode of each compensating transistor being connected to the gate electrode of all the modulation transistors of the associated column, in that one current-carrying electrode of each compensating transistor is connected to the addressing electrode of the associated column of light emitters, and in that the other current-carrying electrode of each compensating transistor is connected to its gate electrode.

6. Display screen according to claim 1, wherein the said modulation transistors and the said associated compensating transistor each include a channel between two layers of doped material, the said channel being connected to their gate electrode, and in that the channel of the modulation transistors of a column and the channel of the associated compensating transistor have a main axis approximately parallel to the said guiding one.

7. Display screen according to claim 1, wherein the control means include initialization means for initializing the load capacitors intended to discharge all the load capacitors connected to the modulation transistors of a column.

8. Display screen according to claim 1, wherein the control means include a plurality of selection transistors having a gate electrode and two current-carrying electrodes, each selection transistor having one current-carrying electrode connected to a modulation transistor, a gate electrode connected to a selection electrode and one current-carrying electrode connected to the compensating transistor of a column of light emitters.

9. Display screen according to claim 1, wherein the light emitters are organic electroluminescent diodes.

10. Display screen according to claim 7, wherein the initialization means include an initialization transistor having a gate electrode and two current-carrying electrodes, one current-carrying electrode of the said initialization transistor being connected to the gate electrode of the modulation transistors of the said column, the gate electrode of the said initialization transistor being connected to a current-carrying electrode and to the addressing electrode of a column of light emitters.

11. Display screen according to claim 7, wherein the initialization means include a diode, the cathode of which is connected to the gate electrode of the modulation transistors and the anode of which is connected to the addressing electrode of a column of light emitters.

* * * * *